(12) United States Patent
Letterman, Jr. et al.

(10) Patent No.: US 6,768,186 B2
(45) Date of Patent: Jul. 27, 2004

(54) SEMICONDUCTOR DEVICE AND LAMINATED LEADFRAME PACKAGE

(75) Inventors: James P. Letterman, Jr., Mesa, AZ (US); Joseph K. Fauty, Mesa, AZ (US); Jay Allen Yoder, Glendale, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/270,401

(22) Filed: Oct. 15, 2002

(65) Prior Publication Data

US 2004/0070062 A1 Apr. 15, 2004

(51) Int. Cl.[7] .................. H01L 23/495; H01L 23/48
(52) U.S. Cl. ............... 257/666; 257/783; 257/775; 257/787; 257/781; 257/784
(58) Field of Search ..................... 257/666, 783, 257/781, 784, 775, 787

(56) References Cited

U.S. PATENT DOCUMENTS

| | | | |
|---|---|---|---|
| 4,785,137 A | * 11/1988 | Samuels ................ | 174/52.4 |
| 5,177,032 A | * 1/1993 | Fogal et al. ............. | 228/175 |
| 5,234,536 A | * 8/1993 | Parthasarathi et al. ...... | 216/20 |
| 5,311,057 A | * 5/1994 | McShane ................ | 257/676 |
| 5,410,180 A | * 4/1995 | Fujii et al. .............. | 257/666 |
| 5,525,836 A | * 6/1996 | Mennucci ............... | 257/748 |
| 5,629,559 A | * 5/1997 | Miyahara ............... | 257/666 |
| 6,007,668 A | * 12/1999 | Kodani et al. ............ | 156/295 |
| 6,278,264 B1 | 8/2001 | Burstein et al. | |
| 6,452,278 B1 | 9/2002 | DiCaprio et al. | |
| 6,469,374 B1 | 10/2002 | Imoto | |
| 6,482,674 B1 | * 11/2002 | Kinsman ................ | 438/106 |
| 6,489,678 B1 | 12/2002 | Joshi | |
| 2002/0038905 A1 | * 4/2002 | Sugizaki ............... | 257/678 |
| 2002/0140063 A1 | * 10/2002 | Yamazaki et al. ......... | 257/668 |

FOREIGN PATENT DOCUMENTS

| | | | | |
|---|---|---|---|---|
| EP | 0706208 B1 | 12/2002 | ......... | H01L/21/60 |
| JP | 10-125849 | * 10/1998 | ......... | H01L/23/50 |
| JP | 11-238840 | * 8/1999 | ......... | H01L/23/50 |
| JP | 2001-345415 | * 12/2001 | ......... | 257/E23.055 |

OTHER PUBLICATIONS

US 2002/0038905A1, Published Apr.4, 2002, Semiconductor Device Provided In Thin Package and Method For Manufacturing The Same, Sugizaki.
US 2002/0140077A1, Published Oct. 3, 2002, Multichip Semiconductor Package, King et al.
US 2002/0153615A1, Published Oct. 24, 2002, Multi–Chip Package Type Smeiconductor Device, Komiyama et al.
http://www.amkor.com/enablingtechnologies/SIP/index-.cfm Amkor Technology, System in Package (SiP) Technology Solution Sheet, at www.amkor.com.

* cited by examiner

*Primary Examiner*—Jasmine Clark

(57) ABSTRACT

An semiconductor device (100) comprising a first semiconductor die (120) and a leadframe (200). The leadframe includes a first laminate (210) having a bottom surface formed with a lead (220) of the semiconductor device, a second laminate (230) overlying the first laminate for mounting the semiconductor die, and an adhesive tape (250) for attaching the first and second laminates.

21 Claims, 4 Drawing Sheets

SEMICONDUCTOR DEVICE AND LAMINATED LEADFRAME PACKAGE

BACKGROUND OF THE INVENTION

The present invention relates in general to semiconductor devices and, more particularly, to small footprint packaged integrated circuits.

Electronic system manufacturers continue to demand components with higher performance and reliability along with a reduced physical size and manufacturing cost. In response, semiconductor manufacturers are developing techniques to reduce the component size and cost by mounting multiple components on a single leadframe that is encapsulated to form a single integrated circuit package.

The size of an integrated circuit package is determined in part by the minimum feature size of the package's leadframe, which sets the width and spacing of the leads. The minimum feature size typically is about equal to the thickness of the leadframe metal, which is a function of the mechanical requirements of the package and the electrical and thermal specifications of the encapsulated circuit. For example, high power circuits often require thicker leadframe metal to support high current levels and adequately dissipate heat generated by the circuit.

Small interconnect feature sizes previously have been achieved by mounting the circuitry on an interposer. An interposer is a type of printed circuit board with layers of thin metal foil sandwiched between dielectric layers and etched to produce the interconnect lines that electrically connect to the components mounted on the interposer. The metal foil is thin, so small feature sizes are achievable. However, for high current devices, the interposer's thin metal lines must be made wide, which offsets the benefit of using a thin foil layer and increases the package footprint. For high power applications, the high thermal resistance of the interposer's thin metal foil results in inadequate heat removal. Moreover, interposers have a high fabrication cost, which further limits their application.

Other devices use a rolled metal leadframe that achieves small feature sizes by thinning the metal with a half-etch technique that selectively etches away portions of the thickness of the leadframe. However, half-etching is poorly controlled when etching very thin leadframes (such as those used to produce very small feature sizes), thus thicker leadframe having larger feature sizes are typically used to produce low cost manufacturable leadframe.

Hence, there is a need for an integrated circuit and package that can house multiple components in a small footprint, has a high current and thermal dissipation capability and a high reliability while maintaining a low manufacturing cost.

DETAILED DESCRIPTION OF THE DRAWINGS

In the figures, elements having the same reference number have similar functionality.

Figure 1:
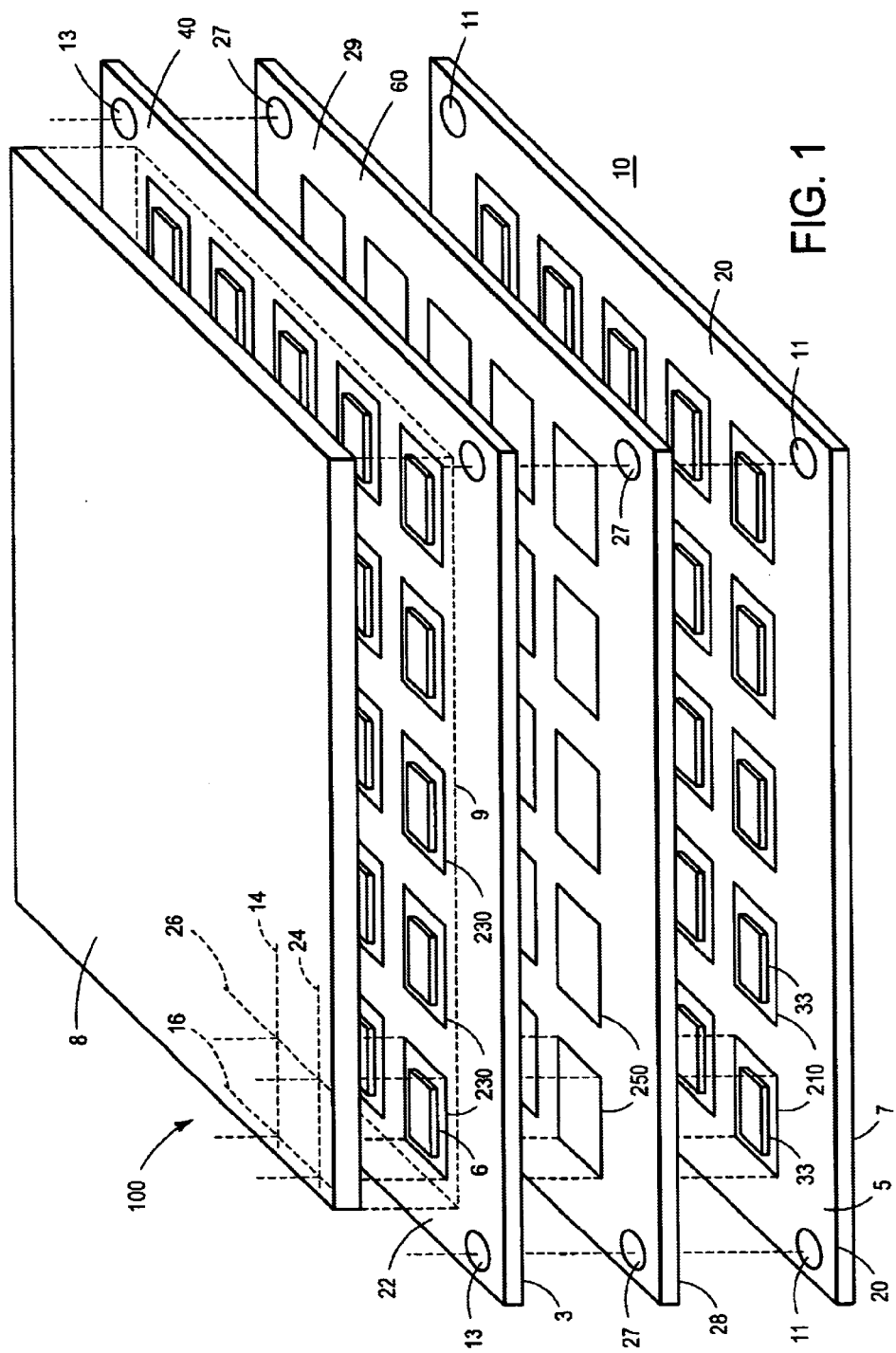
FIG. 1 is an exploded isometric view of a group of integrated circuits at a selected stage of fabrication.

FIG. 1 is an exploded isometric view of an integrated circuit array 10 at a selected stage of fabrication including a leadframe matrix comprising a laminate matrix 20, a dielectric tape 60, a laminate matrix 40 and an overmold or blanket encapsulant 8. A plurality of component sets 6 and 33 are mounted to predetermined locations of laminate matrix 40, and laminate matrix 20 respectively. Note that in applications that do not require the functionality or where lower cost is desired, mounting of component sets on more than one laminate matrix can be eliminated. A singulated device from array 10 is referred to as an integrated circuit 100, which is shown prior to singulation. Array 10 is shown as being formed with two laminate matrices separated by dielectric tape 60, but in some applications, it is advantageous to form leadframe using three or more laminate matrices, each separated from one another by dielectric tape, to achieve a desired level of functionality. Note that component sets 6 and 33 are shown as individual components in order to simplify the description, but often include multiple electrical components mounted using a standard pick-and-place tool or similar equipment. While not shown, the individual components of component sets 6 and 33 include pads, control electrodes or other means in which electrically connections can be made as is well known the art.

Laminate matrix 20 is formed from a sheet of rolled copper or other conductive material which is patterned to form an array of similarly configured leadframe laminates 210 for mounting component sets 33. Laminate matrix 20 is patterned by etching, stamping, milling or almost any other standard leadframe patterning process. Laminate matrix 20 includes alignment holes 11 through which alignment posts (not shown) are inserted for alignment during fabrication. Laminate matrix 20 typically has a thickness greater than about fifty micrometers.

Dielectric tape 60 is formed from a sheet of flexible dielectric material such as Kapton® by punching, stamping, cutting or almost any other standard tape patterning process to form an array of similarly configured dielectric tape 250 for isolating leadframe laminate 210 and 230. Dielectric tape 60 material characteristics include the ability to be folded back upon itself without breaking or permanent distortion. Therefore, dielectric tape 60 is more robust during assembly of leadframe 200. Dielectric tape 60 includes alignment holes 27 through which alignment posts (not shown) are inserted for alignment during fabrication. Dielectric tape 60 typically has a thickness greater than about ten micrometers. In one embodiment, dielectric tape 60 includes a pre-applied adhesive mixture such as epoxy on a bottom surface 28 and a top 29 of the dielectric tape 60 to secure either laminate matrix 20 or 40 respectively to the dielectric tape during the manufacturing process.

Laminate matrix 40 is formed in a similar fashion as laminate matrix 20 from a sheet of rolled copper or other conductive material which is patterned to form an array of similarly configured leadframe laminates 230 whose patterns typically are different from the pattern of leadframe laminate matrix 20 for mounting component sets 6. A plurality of alignment holes 13 is positioned on the alignment posts mentioned above to align laminate matrix 20, dielectric tape 60, and laminate matrix 40 so that leadframe laminates 230 overlie their corresponding leadframe laminates 210 and are separated by dielectric tape 250. Laminate matrix 40 typically has a thickness greater than about fifty micrometers and need not be of the same thickness or material as laminate matrix 20. For example, in one embodiment, laminate matrix 40 has a thickness of about fifty micrometers to facilitate etching features with small dimensions, e.g., a high lead density, while laminate matrix 20 has a thickness of one thousand micrometers to selectively provide a high thermal or electrical conductivity. In another embodiment (not shown) laminate 40 is formed of a metal foil having a thickness of about 20 micrometers and is pre-attached or formed on dielectric tape 60. In yet another embodiment, the patterning of leadframe laminates 20 and 40 are performed after the two laminates are assembled using the dielectric tape sandwiched between them as a means to stop chemical etching. By using the dielectric tape as an etch stop, both laminates can be simultaneously etched using the same etch bath at a cost lower than that of separately etching each laminate.

Array 10 is fabricated as follows. A top surface 5 of laminate matrix 20 is coated with a film of epoxy or other adhesive material (not shown) that can be processed at temperatures less than about three hundred degrees Celsius. A bottom surface 3 of laminate matrix 40 typically is coated with the same material. Dielectric tape 60 is placed between the two laminate matrices and alignment holes 11, 27 and 13 are used to align laminate matrices 210, 230 and dielectric tape 250 while bottom surface 3 is brought into contact with a top surface 29 of dielectric tape 60, and top surface 5 is brought into contact with bottom surface 28. Laminate matrices 20, 40 and dielectric tape 60 then are disposed in a hot press or other standard assembly tool to mechanically bond array 10 while eliminating trapped air and forming a hermetic bond of the laminate matrices to the dielectric tape. Component sets 6 and 33 are then mounted to their specified locations. Wire bonding is performed after laminates 20, 40 and dielectric tape 60 are stacked and assembled. While not shown, typical wirebonding processes produce a wirebond having an end shape such as a ball, tail or stitch from the various means used to attach the wirebond to the surface. Some of the common methods of wirebonding include thermosonic, thermal compression, and combinations of the former and latter. In an alternate embodiment, clip attachment (not shown) is used in place of wire bonding. Clip attachment consists of using a fairly rigid metallic clip formed as a replacement for a wirebond.

In an alternate embodiment where the dielectric tape is pre-formed having an adhesive on surfaces 28 and 29, the above step of coating the laminates with an adhesive can be excluded.

After laminate matrices 20, 40 and dielectric tape 60 are attached, the assembly is placed in a molding tool and encapsulated using a standard thermoset or thermoplastic molding compound to form blanket encapsulant 8. Blanket encapsulant 8 covers component sets 6 and 33 and exposed surfaces of laminate matrices 20, 40 and dielectric tape 60 that are within an encapsulant region 9 on a surface 22 of laminate matrix 40. The encapsulation process leaves a bottom surface 7 of laminate matrix 20 uncovered or exposed in order to provide leads for making external electrical connections to integrated circuit or semiconductor package 100 after singulation.

After blanket encapsulant 8 is cured, laminate matrices 20, 40, dielectric tape 60 and blanket encapsulant 8 are sawn along predetermined cut lines to singulate individual packaged integrated circuits. For example, cut lines 14, 24, 16 and 26 define the path of a saw blade that singulates integrated circuit 100 from array 10 to produce an individual packaged device.

The described lamination scheme allows virtually any number of laminate matrices and dielectric tape to be used to form a semiconductor package, with the maximum number being a function of the desired functionality, manufacturing cost and final package height.

Figure 2:
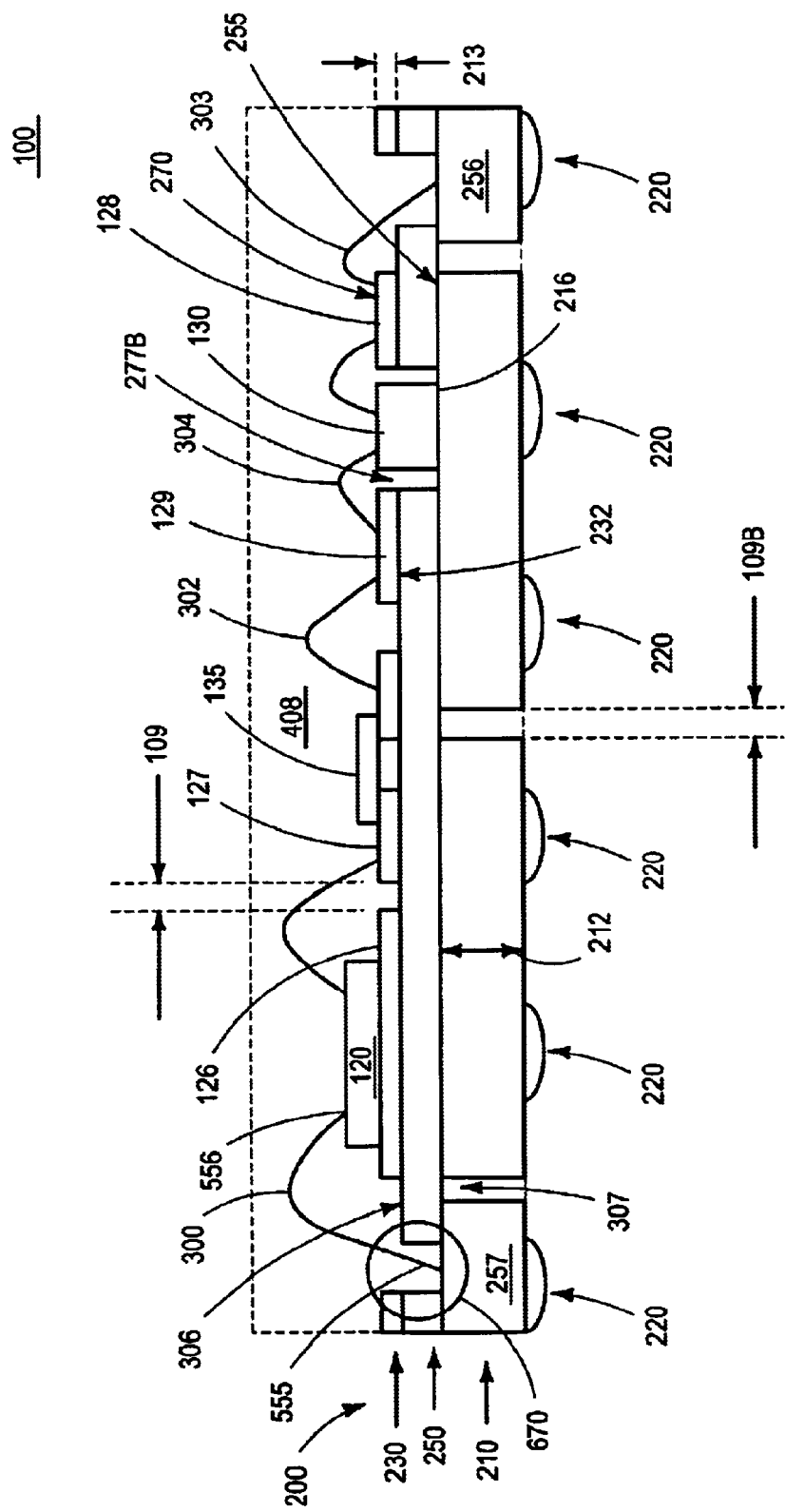
FIG. 2 is a cross-sectional view of a packaged integrated circuit.

FIG. 2 shows a cross-sectional view of a integrated circuit 100 where component set 6 consists of semiconductor die 120 and semiconductor component 135, component set 33 consists of semiconductor die 130, housed in a semiconductor package 100 that includes a leadframe 200 formed by laminates 210, 230 and dielectric tape 250, and a singulated encapsulant 408 of blanket encapsulant 8. Note the left and right surfaces of integrated circuit 100 being defined by cut lines 16 and 26, respectively.

Laminate 230 is etched to form die flag 126 for mounting semiconductor die 120, component pad 127 for mounting semiconductor component 135, and bond pads or islands 128–129 for wirebond leads 302–304. With current processing technology, the minimum feature size of laminate 230, such as a spacing 109 between die flag 126 and die flag 127, is about equal to its thickness. Hence, in one embodiment, where laminate 230 thickness 213 is two hundred fifty micrometers thick, the width of spacing 109 is also about two hundred fifty micrometers.

Laminate 210 is etched to form die flag 216 for mounting semiconductor die 130, bond pads or regions 256–257 for wirebond leads 300 and 303, and leads 220 for attaching integrated circuit 100 to a customer printed circuit board (not shown). While leads 220 are shown in FIG. 2 as ball grid array (BGA) type, other lead types such as quad flat-pack no-lead (QFN) can be formed. In one embodiment, laminate 210 thickness 212 is about two hundred micrometers thick, the width of spacing 109B is also about two hundred micrometers.

Laminate 230 is attached at bottom surface 232 to top surface 306 of dielectric tape 250, and laminate 210 is attached at top surface 255 to bottom surface 307 of dielectric tape 250 as shown.

A wirebond 300 is formed between semiconductor die 120 and bond pad or region 257 to make an external electrical connection from semiconductor die 120, wirebond 300, bond pad or region 257 and lead 220. Note that wirebond 300 passes through dielectric tape 230 as shown in opening 670, and that although a portion of the dielectric tape 250 to the left of opening 670 is shown within the semiconductor package 100, this portion may be eliminated to further reduce the overall size of the semiconductor package 100. Note that wirebond 300 has end 555 connecting to region 257 at a lower plane than surface 270 or 306, thus the loop height of wirebond 300 is made significantly lower than would be possible with other semiconductor packaging techniques without introducing mechanical stresses in wirebond 300. Similarly, a wirebond 303 is formed between bond pad or region 128 and bond pad or region 256 for making an external electrical connection from semiconductor die 130 through wirebond 303B, bond pad or region 128, wirebond 303, bond pad or region 256, and lead 220. Additionally, a wirebond 304 is formed between semiconductor die 130 and die pad or island 129 for electrically coupling semiconductor component 135 to semiconductor die 135. Electrical connection to external devices or a printed circuit board is made through features defined on bottom surface 7, which remains exposed after the encapsulation process.

Figure 3:
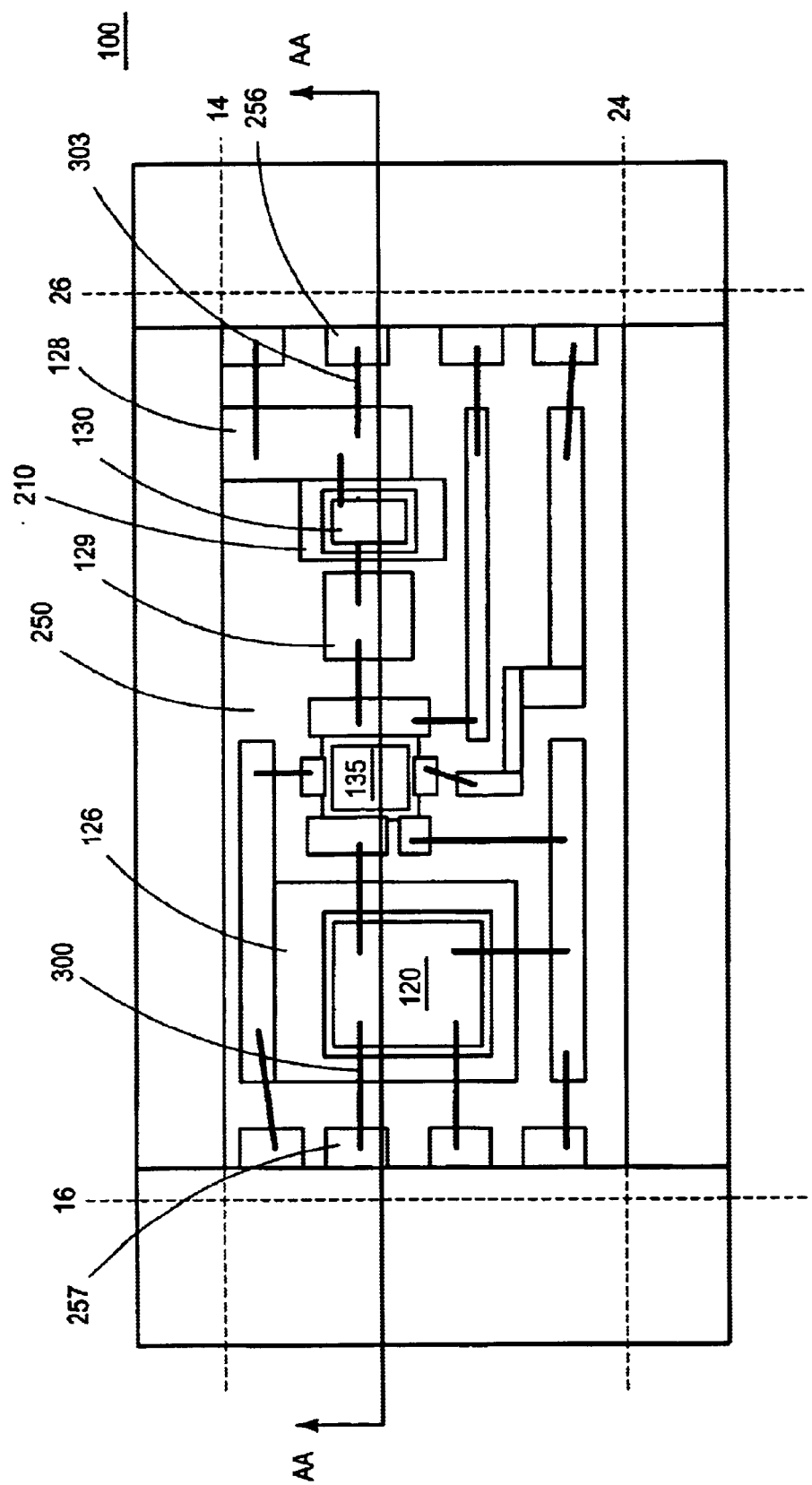
FIG. 3 is a top view of the packaged integrated circuit of FIG. 2.

FIG. 3 shows a top view of the integrated circuit 100 of FIG. 2 wherein the cross sectional view of FIG. 2 is obtained by cross section at cut line AA. The die flag 126, or island 129 formed as above has the advantage of isolation from the edges of the semiconductor package 100. In other words, die flag 126 or bond pad 129 does not require a rigid connection to another portion of laminate 230 to prevent movement during such operations as wirebond or die placement. Such die pad 126 or island 129 isolation is made possible by attaching the laminate 230 (which includes bond pad 129) to dielectric tape 250 thus preventing movement during later operations. Additionally, die pad 126 or islands 129 can be made as large or small as necessary to optimize characteristics of the die pad 126 or island 129 such as thermal conduction, electrical resistance, or the like without having to provide the above mentioned rigid connection.

Figure 4:
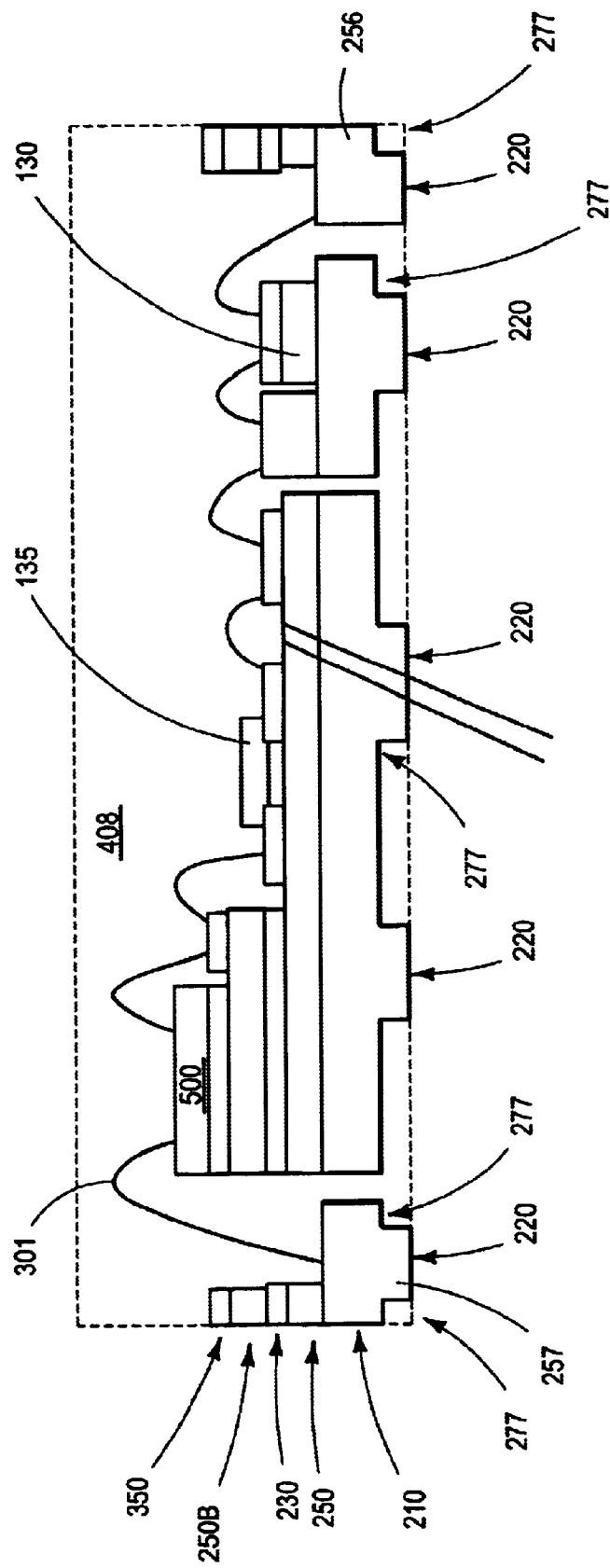
FIG. 4 is a cross-sectional view of a packaged integrated circuit in an alternate embodiment.

FIG. 4 shows a cross-sectional view of integrated circuit 100 in an alternate embodiment. The elements of integrated circuit 100 have structures and functionality similar to what is shown and described in FIG. 2 and FIG. 3, except that package 100 is formed as a three-tiered lamination. FIG. 4 shows package 100 as including a third laminate 350 (for mounting a semiconductor die or component 500) separated from laminate 230 by dielectric tape 250B.

Note that regions 256–257 are defined by cut lines 26 and 16, respectively, while QFN style leads 220 are recessed a distance from cut line 16 and 26, respectively. Although leads 220 are shown as being QFN style, other types are easily incorporated. In effect, the bottom surfaces of regions 256–257 of laminate 210 extend outwardly to form a shelf. This arrangement allows encapsulating material to flow under and cover exposed portions of laminate 210 to form mold locks 277. Many semiconductor packages use mold locks to improve mechanical adhesion and prevent encapsulant lift-off to improve reliability. However, because leadframe 200 includes more than one laminate, laminate 210 can be made thick (e.g., dimension 212) so the half-etching used to form the mold locks 277 can use easily controlled. Additionally, laminate 230 provides various upper surface mold lock features 277B.

Note that above provides not only a structure for electrically coupling a semiconductor die or component to a package lead, but also for electrically coupling between semiconductor dice or components housed in the same package. Moreover, various combinations of semiconductor devices and components having different thermal dissipation and current handling requirements can be easily integrated into a single package by forming leadframe laminate 230 and 210 with the appropriate feature sizes and thicknesses, thereby avoiding the need to use multiple packaged devices to achieve similar functionality. Additionally, stocking costs associated with producing integrated circuits having varying components or semiconductor die can be reduced by using for example a standardized laminate 20, varying laminate 40 and/or dielectric tape 60 for differences in pin outs, connection densities, thermal and current properties. Furthermore, by using the dielectric tape 60 as an etch stop, manufacturing costs can be further decreased by simultaneous etching of two or more laminates.

In summary, the present invention provides a low cost integrated circuit and package that economically combines small features with a high current capability. An integrated circuit comprises a first semiconductor die and a leadframe. The leadframe includes a first laminate having a bottom surface formed with a lead of the integrated circuit, a second laminate overlying the first laminate for mounting the semiconductor die, and an adhesive tape for attaching the first and second laminates. The invention provides a low cost structure that combines a high lead density with a high current capability and provides higher quality mold locks, and crossover interconnections.

What is claimed is:

1. A semiconductor device, comprising:
   a first semiconductor die;
   a leadframe that comprises:
      a first laminate having a bottom surface formed with a lead of the semiconductor device;
      a second laminate overlying the first laminate for mounting the semiconductor die; and
      a dielectric tape for attaching the first and second laminates.

2. The semiconductor device of claim 1, wherein the dielectric tape is formed having surfaces of adhesive material.

3. The semiconductor device of claim 1, further comprising a first wirebond for coupling a pad of the first semiconductor die through the second laminate to the lead.

4. The semiconductor device of claim 2, further comprising a second wirebond having a first end for attaching to a top surface of the first laminate and a second end for attaching to a top surface of the second laminate.

5. The semiconductor device of claim 1, further comprising molding compound for encapsulating the first semiconductor die.

6. The semiconductor device of claim 1, wherein a bottom surface of the first semiconductor die is mounted on a top surface of the second laminate, and the first laminate has a thickness greater than a thickness of the second laminate.

7. The semiconductor device of claim 6, wherein the first laminate has a thickness greater than about 100 micrometers.

8. The semiconductor device of claim 4, wherein the leadframe further includes a third laminate overlying the second laminate for mounting a second semiconductor die.

9. The semiconductor device of claim 8, further comprising a third wirebond for electrically coupling a pad of the second semiconductor die through the third laminate to the lead.

10. The semiconductor device of claim 6, wherein first and second laminates comprise rolled copper material.

11. The semiconductor device of claim 10, wherein the first and second laminates are each formed to a thickness greater than fifty micrometers.

12. A semiconductor package, comprising:
   a first laminate formed with a lead of the semiconductor package;
   a second laminate formed over the first laminate and having a region electrically insulated from the first laminate, wherein the second laminate has a surface for mounting a first semiconductor die;
   a bond device for coupling the first laminate to the region of the second laminate; and
   a dielectric tape separating first and second laminates.

13. The semiconductor package of claim 12, further including a third laminate overlying the second laminate for mounting said second semiconductor die.

14. The semiconductor package of claim 12, wherein first and second laminates comprise rolled copper material.

15. The semiconductor package of claim 14, wherein the first and second laminates are each formed to a thickness greater than fifty micrometers.

16. A laminated leadframe packaged device comprising:
   a laminated leadframe including a first conductive portion, a second conductive portion, and an insulating tape disposed between the first and second conductive portions;
   a first electrical component coupled to the first conductive portion;
   a second electrical component coupled to the second conductive portion; and an encapsulating layer covering the first and second electrical components.

17. The device of claim 16 wherein the first electrical component is electrically coupled to the second electrical component.

18. The device of claim 17 wherein the first electrical component is electrically coupled to the second electrical component with a wirebond.

19. The device of claim 16 wherein the first conductive portion includes an external lead.

20. The device of claim 16 wherein the insulating tape comprise an adhesive tape.

21. The device of 16 wherein one of the first and second conductive portions is thicker than about fifty micrometers.

* * * * *